(12) United States Patent
Grbovic

(10) Patent No.: US 8,427,226 B2
(45) Date of Patent: Apr. 23, 2013

(54) DEVICE FOR CONTROLLING A POWER TRANSISTOR

(75) Inventor: Petar Grbovic, Vernon (FR)

(73) Assignee: Schneider Toshiba Inverter Europe SAS, Pacy sur Eure (FR)

( * ) Notice: Subject to any disclaimer, the term of this patent is extended or adjusted under 35 U.S.C. 154(b) by 250 days.

(21) Appl. No.: 12/818,683

(22) Filed: Jun. 18, 2010

(65) Prior Publication Data

US 2011/0006838 A1  Jan. 13, 2011

(30) Foreign Application Priority Data

Jul. 7, 2009 (FR) ...................................... 09 54681

(51) Int. Cl.
*H03K 17/687* (2006.01)

(52) U.S. Cl.
USPC ............................ 327/427; 327/108; 327/112

(58) Field of Classification Search .................. 327/108, 327/112, 530–535, 540–543, 427
See application file for complete search history.

(56) References Cited

U.S. PATENT DOCUMENTS

| 5,399,913 | A | * | 3/1995 | Widener et al. | ............... | 327/108 |
| 6,445,557 | B1 | | 9/2002 | Weinert et al. | | |
| 2010/0001785 | A1 | * | 1/2010 | Baginski et al. | ............... | 327/513 |

OTHER PUBLICATIONS

Petar J. Grbovic, "An IGBT Gate Driver for Feed-Forward Control of Turn-on Losses and Reverse Recovery Current", IEEE Transactions on Power Electronics, vol. 23, No. 2, Mar. 1, 2008, pp. 643-652.

* cited by examiner

*Primary Examiner* — Lincoln Donovan
*Assistant Examiner* — Diana J Cheng
(74) *Attorney, Agent, or Firm* — Oblon, Spivak, McClelland, Maier & Neustadt, L.L.P.

(57) ABSTRACT

The invention relates to a gate control device for a JFET-type transistor that has a gate, a drain and a source. The gate control device includes a voltage generation circuit comprising an output connected to the gate of the transistor, where the circuit is designed to generate at the output a reference gate-source voltage following a predetermined voltage ramp. A voltage limiting circuit is designed to limit the reference gate-source voltage to a predetermined maximum value when the gate-source voltage at the terminals of the JFET transistor has reached said maximum value.

11 Claims, 3 Drawing Sheets

Figure 1:
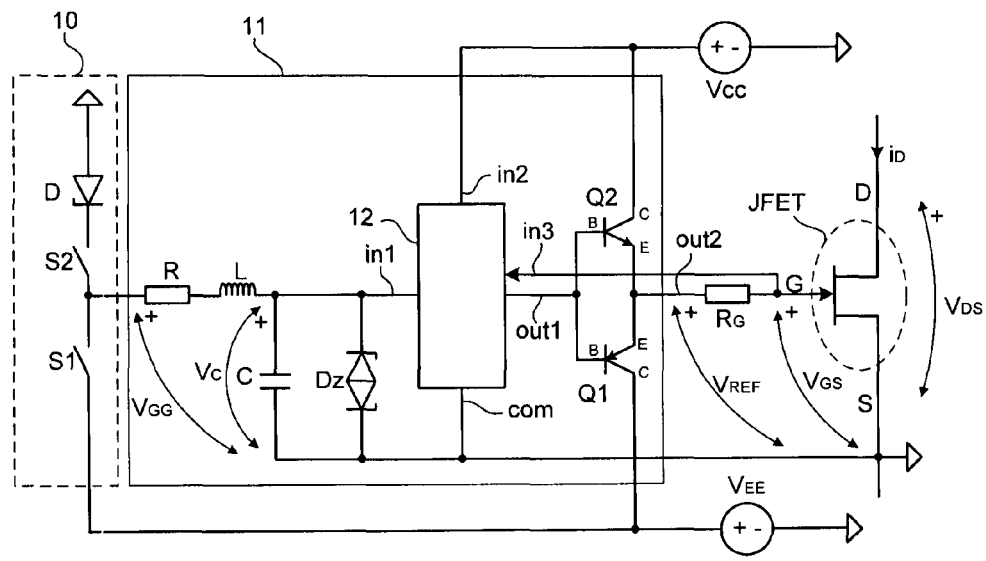

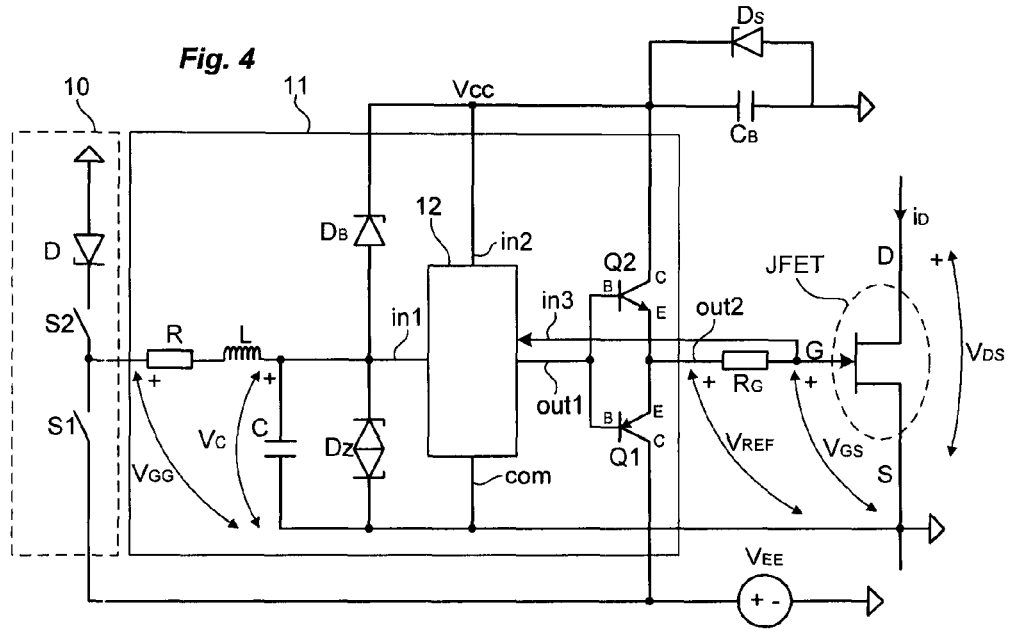
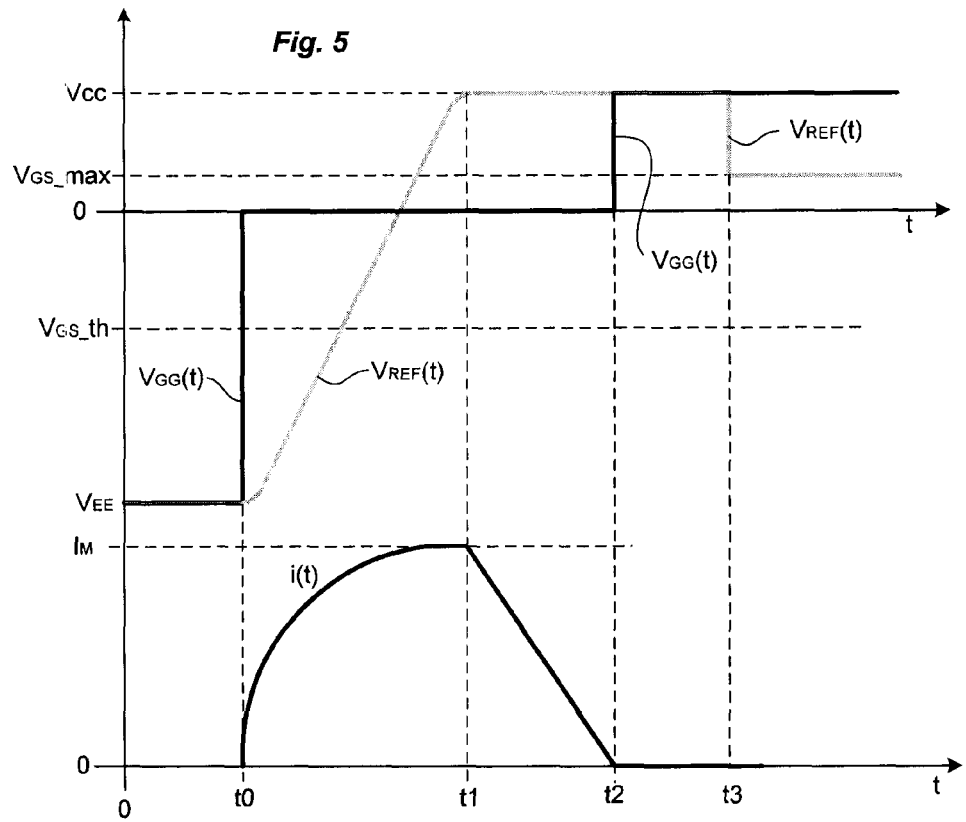

DEVICE FOR CONTROLLING A POWER TRANSISTOR

The present invention relates to a control device for a power transistor, more particularly a junction field effect transistor JFET. The JFET transistor will, for example, be made of a high band-gap energy material such as silicon carbide or gallium nitride. This type of transistor can notably be used in an inverter with pulse width modulation (PWM).

Many publications have been written concerning the control of transistors, notably of IGBT (insulated gate bipolar transistor) type.

In the control of a transistor, the main problem to be resolved is how to control the switching speed of the transistor. For this, it is essential to be able to control, independently of one another, the variation of the current as a function of time (di/dt) and the variation of the voltage as a function of time (dV/dt). When the transistor is switched ON, the aim is, for example, to reduce di/dt and increase dV/dt. However, most of the time, the known control functions are not satisfactory.

The publication entitled "An IGBT Gate Driver for Feed-Forward control Turn-on Losses and Reverse Recovery Current" by Petar J. Grbovic—IEEE Transactions on Power Electronics, Vol 23, N° 2, March 2008, page 643 describes a satisfactory control device for an IGBT-type transistor. This type of device makes it possible notably to limit the losses when a transistor is switched ON. The gate resistor is chosen to provide a trade-off between the switching losses of the transistor, the amplitude of the reverse conduction current of the freewheeling diode associated with the transistor and the electromagnetic interference generated. However, this device remains unsuitable for controlling a JFET-type transistor. In practice, in a JFET, the voltage range between the minimum switching-ON voltage and the maximum voltage that can be supported by the transistor is very restricted. Because of this, the JFET transistor requires a very accurate control device in which the switching performance characteristics must be optimized. By optimizing the performance characteristics when the transistor is switched ON, it is thus possible to reduce the switching losses and the electromagnetic interference.

The aim of the invention is to propose a control device for a JFET-type transistor that has performance characteristics optimized to reduce the switching losses and the electromagnetic interference when the transistor is switched ON.

This aim is achieved with a gate control device for a JFET-type transistor comprising a gate, a drain and a source, said device being characterized in that it comprises:

- a voltage generation circuit comprising an output connected to the gate of the transistor, said circuit being designed to generate at the output a reference gate-source voltage following a predetermined voltage ramp,
- a voltage limiting circuit designed to limit the reference gate-source voltage to a predetermined maximum value when the gate-source voltage at the terminals of the JFET transistor has reached said maximum value.

According to a particular feature of the invention, the limiting circuit comprises an input to which is applied the voltage at the terminals of a capacitor and an output on which is generated the reference gate-source voltage.

According to another particular feature, the limiting circuit comprises a bipolar transistor and comparison means between the gate-source voltage of the JFET transistor and the predetermined maximum value.

According to another particular feature, the limiting circuit comprises a diode and the maximum value is determined by the sum of the conduction threshold voltage of the bipolar transistor and the conduction threshold voltage of the diode.

According to another particular feature, the voltage generation circuit comprises a resistor, an inductor and a capacitor connected in series, forming an RLC circuit connected between the output of an input circuit and the source of the JFET transistor and a clamping diode connected in parallel with the capacitor of the RLC circuit between an input of the limiting circuit and the source of the JFET transistor.

According to another particular feature, the voltage generation circuit comprises two bipolar transistors in series, the two bases of which are commoned and connected to the output of the limiting circuit.

According to another particular feature, the first bipolar transistor of the voltage generation circuit is of PNP type and the second transistor is of NPN type, the emitter terminals of the transistors being commoned.

According to another particular feature, the control device comprises an input circuit designed to generate at the output a control signal for the JFET transistor.

According to another particular feature, the device comprises a gate resistor connected between the gate of the transistor and the output of the voltage generation circuit.

According to another particular feature, the device comprises a diode and a capacitor connected in series between a first input of the limiting circuit and the ground and a stabilization diode connected in parallel with the capacitor.

The invention also relates to a power converter with an inverter stage comprising a number of JFET-type transistors, each JFET transistor being controlled by virtue of a control device as defined hereinabove.

The invention can be applied to the control of a JFET transistor of normally OFF type or of normally ON type.

The control device of the invention makes it possible to control independently the variation of current as a function of time passing through the transistor and therefore the electromagnetic interference generated by this variation, and the voltage variation between the drain and the source of the transistor, and therefore the switching losses.

Figure 3:
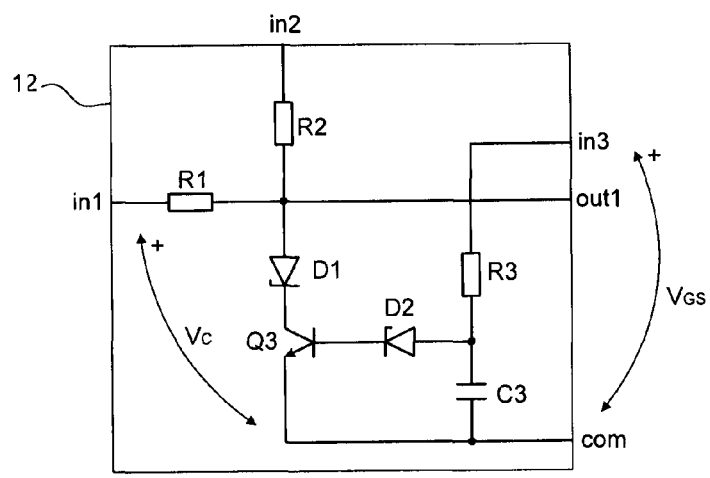
Figure 2:
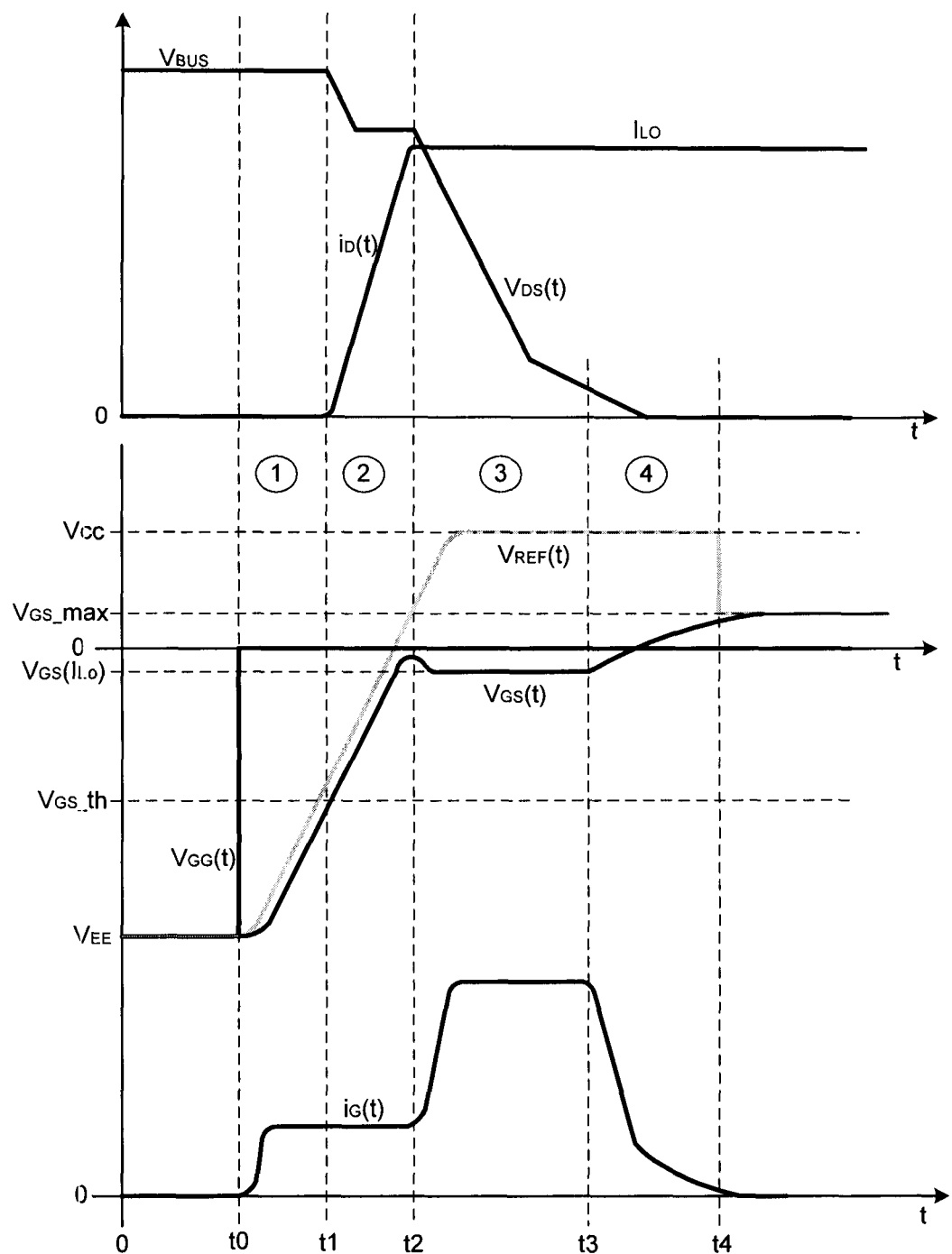

Other features and advantages will emerge from the following detailed description by referring to an embodiment given by way of example and represented by the appended drawings in which:

FIG. 1 represents the device of the invention intended for the control of a JFET-type transistor, FIG. 2 shows the trend of the various current and voltage parameters in the control device represented in FIG. 1, FIG. 3 more particularly represents the voltage limiting circuit used in the control device of the invention, FIG. 4 represents a variant embodiment of the device of the invention, FIG. 5 shows the trend curves of the power supply voltage and of the current in the device represented in FIG. 4.

The device of the invention is applicable to the control of a transistor of JFET (junction field effect transistor) type.

A JFET transistor is a known power electronic switch which comprises a control gate (G), the function of which is to enable or prevent the passage of a current between a drain (D) and a source (S). Such a transistor is of normally ON type if the voltage $V_{GS}$ between the gate and the source is close to zero. This means that the drain-source path is passing or conducting in the absence of control voltage $V_{GS}$. Conversely, a JFET transistor is of normally OFF type if the drain-source path is not conducting in the absence of voltage $V_{GS}$ between gate and source.

According to the invention, the controlled JFET transistor will preferably be fabricated from a wide band gap material, for example silicon carbide or gallium nitride, in order to exhibit a low resistance in the passing state ($R_{DSon}$), and therefore generate limited losses, and withstand high voltages (greater than 600 V).

A normally ON JFET transistor requires the application of a voltage $V_{GS}$ between gate and source which is negative in order to be switched OFF. This voltage is typically between −5 volts and −15 volts.

A normally OFF JFET transistor requires the application of a voltage $V_{GS}$ between gate and source which is positive in order to be switched ON. This positive voltage is typically between +1 volt and +3 volts.

JFET transistors can be employed in switching applications ranging from a few kilohertz to a few hundred kilohertz, such as power conversion type applications like speed variation, switched-mode power supply or uninterruptible power supply.

Hereinafter in the description, the device of the invention is described for the control of a JFET transistor of normally OFF type. Obviously, the control device of the invention is perfectly suited to the control of a JFET transistor of normally ON type.

The control device of the invention notably comprises an input circuit 10, a voltage generation circuit 11, a voltage limiting circuit 12 and a gate resistor $R_G$.

The input circuit 10 is designed to generate a control signal on the gate of the JFET transistor. It comprises a diode D and two switches S1, S2 in series. The output of the input circuit 10 is connected to the point situated between the two switches. The input circuit 10 is designed to generate a power supply input voltage $V_{GG}$ that can take a positive value designated $V_{CC}$, for example equal to +5 V to switch ON the JFET and a negative value designated $V_{EE}$ ranging from −15 V to −20 V to switch OFF the JFET transistor.

The voltage generation circuit 11 is connected to the output of the input circuit 10 and is designed to generate a reference gate-source voltage $V_{REF}$, hereinafter designated reference voltage $V_{REF}$, according to a predetermined voltage ramp. The slope of the reference voltage $V_{REF}$ ramp is approximately constant.

The voltage generation circuit 11 notably comprises a passive RLC circuit and a clamping diode $D_Z$. The resistor R, the inductor L and the capacitor C of the RLC circuit are connected in series between the output of the input circuit 10 and the source S of the controlled JFET transistor. For its part, the clamping diode $D_Z$ is connected in parallel with the capacitor C of the RLC circuit. The connection point situated between the inductor L and the capacitor C is connected to a first input (in1) of the voltage limiting circuit 12. The voltage generation circuit 11 also comprises two bipolar transistors Q1, Q2 in series. The transistor Q1 is of NPN type and has its collector (C) connected to the positive voltage Vcc. The transistor Q2 is of PNP type with the emitter (E) connected to the emitter (E) of the transistor Q1 and the collector (C) connected to the negative voltage $V_{EE}$. The bases (B) of the two transistors Q1, Q2 are commoned, a connection point connected to the two bases of the transistors Q1, Q2 being connected to the output (out1) of the voltage limiting circuit 12.

The voltage limiting circuit 12 represented in FIG. 3 for its part comprises resistors R1, R2, R3, diodes D1 and D2, a capacitor C3 and an NPN-type bipolar transistor Q3. The first input (in1) of the voltage limiting circuit 12 is thus directly connected to the output (out1) of the limiting circuit via the resistor R1. A second input (in2) of the limiting circuit is connected to the positive power supply voltage $V_{CC}$ and connected to the output (out1) of the limiting circuit via the resistor R2. The capacitor C3 and the resistor R3 are connected in series between a third input (in3) and a common terminal (com) of the limiting circuit 12. The third input (in3) of the limiting circuit 12 is connected to the gate G of the JFET transistor whereas the common terminal (com) is connected to the source S of the JFET transistor. The diode D1 is connected between the output (out1) of the limiting circuit 12 and the collector C of the transistor Q3, whereas the emitter of the transistor Q3 is connected to the common terminal (com). The diode D2 is, for its part, connected between the base of the transistor Q3 and the connection point situated between the resistor R3 and the capacitor C3 in series.

In this way, the voltage $V_C$ at the terminals of the capacitor C is applied between the first input (in1) of the limiting circuit 12 and the common terminal (com) which is connected to the source S of the JFET. Moreover, the gate-source voltage $V_{GS}$ of the JFET transistor is applied between the third input (in3) and the common terminal (com) of the limiting circuit 12.

The output (out2) of the voltage generation circuit is connected via the gate resistor $R_G$ to the gate of the controlled JFET transistor. The reference voltage $V_{REF}$ delivered by the voltage generation circuit 11 is applied between the output out2 of the voltage generation circuit 11 and the source S of the JFET transistor.

The principle of the invention is to optimize the switching-ON of the JFET transistor. In order to speed up the switching-ON of the JFET transistor, it is essential to have a gate current $i_G$ that is sufficiently high. However, the conduction losses and the electromagnetic interference must remain limited.

The switching-ON sequence may be split into four separate phases, details of which are given below with reference to FIG. 2:

Phase 1

A signal to switch ON the JFET transistor is sent to the control device that results in the closure of the switch S2 and the charging of the RLC circuit via the diode D. After the switch S2 closes, the voltage $V_C$ at the terminals of the capacitor C increases from the power supply negative value $V_{EE}$ to zero. The reference voltage $V_{REF}$ increases according to the predetermined ramp of slope $dV_{REF}/dt$, also leading, with a slight delay, according to the same slope, to an increase in the gate-source voltage $V_{GS}$ at the terminals of the controlled JFET transistor. During this first phase, the gate-source voltage $V_{GS}$ is less than the threshold value $V_{GS\_th}$ for switching on the JFET. Consequently, the drain current $i_D$ is zero.

Phase 2

The gate-source voltage $V_{GS}$ reaches the threshold value $V_{GS\_th}$ for switching on the JFET. The drain current $i_D$ therefore begins to pass through the JFET between the drain D and the source S. As the gate-source voltage $V_{GS}$ continues to increase, the drain current $i_D$ also increases according to the slope by which the gate-source voltage $V_{GS}$ increases and the characteristics of the JFET transistor. Consequently, the variation of the drain current $i_D$ is controlled by the variation of the gate-source voltage $V_{GS}$ and therefore by the reference voltage $V_{REF}$.

Phase 3

The drain current $i_D$ reaches the value of the charge current $i_{LO}$ and the drain-source voltage $V_{DS}$ begins to drop. The drop in the drain-source voltage $V_{DS}$ is associated with the significant increase in the gate current $i_G$. This drop in the drain-source voltage $V_{DS}$ stems from the Miller effect of the JFET transistor. On the Miller plateau, since the transistor is in the active region, the gate-source voltage $V_{GS}$ is constant which causes the drain current $i_D$ to be kept constant at the value of the charge current $I_{LO}$. Since the reference voltage $V_{REF}$ continues to increase to reach the positive voltage $V_{CC}$, the current $i_G$ injected on the gate G of the JFET transistor also increases. In practice, the difference between the reference voltage $V_{REF}$ and the gate-source voltage $V_{GS}$ corresponds to the voltage $V_G$ at the terminals of the gate resistor $R_G$. Thus, the greater the difference between the reference voltage $V_{REF}$ and the gate-source voltage $V_{GS}$, the greater the current $i_G$ injected on the gate G of the JFET transistor. Furthermore, if the gate resistor $R_G$ has a particularly low value, the gate current $i_G$ increases significantly. If we assume that the gate resistor $R_G$ has a low value, for example of a few ohms, the gate current $i_G$ can therefore be high, and the higher the gate current $i_G$, the faster the decrease in the drain-source voltage $V_{DS}$. Thus, the voltage drift is limited and the switching losses upon switching on the JFET transistor are reduced.

Phase 4

Once the drain-source voltage $V_{DS}$ approaches zero, the gate-source voltage $V_{GS}$ continues its increase following the progression of the reference voltage $V_{REF}$. However, when the gate-source voltage $V_{GS}$ reaches the maximum value $V_{GS\_max}$, the gate-source voltage $V_{GS}$ must be limited in order to avoid damaging the component. For this, the reference voltage $V_{REF}$ is reduced to the maximum value $V_{GS\_max}$ in order to cap the gate-source voltage at the maximum value $V_{GS\_max}$.

The energy dissipated when switching on the transistor is expressed by the following relation:

$$Eon \cong \frac{1}{2}\left(\frac{V_{BUS} \cdot (I_{L0})^2}{\frac{di_D}{dt}} + \frac{C_{DS} \cdot I_{L0} \cdot V_{BUS}^2}{i_G}\right)$$

$$= \frac{1}{2}\left(\frac{V_{BUS} \cdot (I_{L0})^2}{f_1\left(\frac{dV_{gs}}{dt}\right)} + \frac{C_{DS} \cdot I_{L0} \cdot V_{BUS}^2}{f_2(R_G)}\right)$$

From this formula, it can be seen that the switching losses depend on the variation of the gate-source voltage $V_{GS}$ over time and on the amplitude of the gate current $i_G$.

During operating phase No. 4, the reference voltage $V_{REF}$ is limited to the maximum value $V_{GS\_max}$ by virtue of the limiting circuit 12 represented in FIG. 3. When the gate-source voltage $V_{GS}$ which is applied between the third input (in3) and the common terminal (com) of the limiting circuit is less than the sum of the conduction threshold voltage $V_{BE}$ of the transistor Q3 and the conduction threshold voltage $V_{D2}$ of the diode D2 of the limiting circuit 12, the transistor Q3 is then blocked and the voltage $V_C$ at the terminals of the capacitor C is transferred directly to the output (out1) of the limiting circuit 12. When the gate-source voltage $V_{GS}$ becomes greater than the sum of the conduction threshold voltages of the transistor Q3 and of the diode D2, the transistor Q3 begins to conduct which has the effect of limiting the voltage applied to the output (out1) of the limiting circuit 12. Since the voltage applied to the output (out1) is the reference voltage $V_{REF}$, the gate-source voltage $V_{GS}$ will automatically be limited. Since $V_{GS\_max} \leq V_{BE} + V_{D2}$, and assuming that the conduction threshold voltage $V_{BE}$ of the transistor Q3 is 0.7 V and that the conduction threshold voltage $V_{D2}$ of the diode D2 is 0.7 V, the maximum gate-source voltage $V_{GS\_max}$ is 1.4 V. In the limiting circuit 12 represented in FIG. 3, the resistor R3 and the capacitor C3 form a low-pass filter which is employed to filter the high-frequency noise on the gate-source voltage $V_{GS}$ and make it possible to limit the instability of the regulation on the maximum gate-source voltage $V_{GS\_max}$. The resistor R2 is employed as a bias resistor for the transistor Q3 once the switching of the JFET transistor is finished.

FIG. 4 shows a variant embodiment of the device of FIG. 1. As mentioned previously, the gate-source voltage $V_{GS}$ must be slightly positive to switch ON the JFET transistor. For this, it is essential to have a positive power supply voltage designated $V_{CC}$ hereinabove. The variant of FIG. 4 involves eliminating the positive portion of the power supply voltage and generating this positive power supply voltage directly in the control device which makes it possible to reduce the complexity of the power supply system of the control device. For this, the control device includes a diode $D_B$, called boost diode, a capacitor $C_B$, called boost capacitor, and a diode $D_S$. The diode $D_B$ and the capacitor $C_B$ are connected in series between the first input in1 of the limiting circuit 12 and the ground. The diode $D_S$ is connected in parallel with the capacitor $C_B$.

Referring to FIG. 5, at the instant t0, a signal to switch ON the JFET transistor is sent to the control device causing the switch S2 to close and the gate control voltage $V_{GG}$ to appear. The capacitor C is charged so that its voltage $V_C$ increases from the negative power supply voltage $V_{EE}$ to the positive power supply voltage $V_{CC}$, passing through zero. At the instant t1, the voltage at the terminals of the capacitor C reaches the value $V_{CC}$ and the diode $D_B$ begins to conduct the current. The energy then stored in the inductor L, dependent on the maximum current $I_M$, can then be released into the capacitor $C_B$. The quantity of energy released into the capacitor $C_B$ is then identical regardless of the instant at which the JFET transistor is switched ON. This energy therefore makes it possible to cover the positive portion of the power supply of the control device and therefore maintain a voltage $V_{CC}$. The maximum voltage is stabilized by virtue of the Zener diode $D_S$. At the instant t2, the current passing through the inductor becomes zero and remains at zero because the diode D is blocking. The capacitor C remains charged at the positive voltage $V_{CC}$.

The invention claimed is:

1. A gate control device for a JFET transistor including a gate, a drain and a source, said gate control device comprising:
    a voltage generation circuit including an output connected to the gate of the JFET transistor, said circuit being designed to generate at the output a reference gate-source voltage following a predetermined voltage ramp; and
    a voltage limiting circuit connected to the gate and source of the JFET transistor and designed to limit the reference gate-source voltage to a predetermined maximum value when the gate-source voltage between the gate and source of the JFET transistor has reached said maximum value, the voltage limiting circuit determining when the gate-source voltage of the JFET transistor reaches the maximum value by directly sensing a gate voltage of the JFET transistor.

2. The gate control device according to claim 1, wherein the voltage limiting circuit comprises an input to which is applied a voltage at terminals of a capacitor and an output designed to generate the reference gate-source voltage.

3. The gate control device according to claim 1, wherein the voltage limiting circuit comprises a bipolar transistor and comparison means between the gate-source voltage of the JFET transistor and the predetermined maximum value.

4. The gate control device according to claim 3, wherein the voltage limiting circuit comprises a diode and the maximum value is determined by a sum of a conduction threshold voltage of the bipolar transistor and a conduction threshold voltage of the diode.

5. The gate control device according to claim 1, wherein the voltage generation circuit comprises a resistor, an inductor and a capacitor connected in series, forming an RLC circuit connected between an output of an input circuit and the source of the JFET transistor and a clamping diode connected in parallel with the capacitor of the RLC circuit between an input of the limiting circuit and the source of the JFET transistor.

6. The gate control device according to claim 5, wherein the voltage generation circuit comprises two bipolar transistors in series, both bases of which are connected in common and connected to an output of the limiting circuit.

7. The gate control device according to claim 6, wherein a first bipolar transistor is a PNP transistor and a second transistor is a NPN transistor, the emitter terminals of the transistors are connected in common.

8. The gate control device according to claim 1, further comprising:
an input circuit designed to generate at an output thereof a control signal for the JFET transistor.

9. The gate control device according to claim 1 further comprising:
a gate resistor connected between the gate of the JFET transistor and the output of the voltage generation circuit.

10. A gate control device for a JFET transistor including a gate, a drain and a source, said gate control device comprising:
a voltage generation circuit including an output connected to the gate of the JFET transistor, said circuit being designed to generate at the output a reference gate-source voltage following a predetermined voltage ramp;
a voltage limiting circuit designed to limit the reference gate-source voltage to a predetermined maximum value when the gate-source voltage between the gate and source of the JFET transistor has reached said maximum value;
a diode and a capacitor connected in series between a first input of the limiting circuit and ground; and
a stabilization diode connected in parallel with the capacitor.

11. A power converter with an inverter stage comprising plural JFET transistors, each JFET transistor being controlled by a control device comprising:
a voltage generation circuit including an output connected to the gate of the JFET transistor, said circuit being designed to generate at the output a reference gate-source voltage following a predetermined voltage ramp; and
a voltage limiting circuit designed to limit the reference gate-source voltage to a predetermined maximum value when the gate-source voltage between the gate and source of the JFET transistor has reached said maximum value, the voltage limiting circuit determining when the gate-source voltage of the JFET transistor has reached the predetermined maximum by directly sensing a gate voltage of the JFET transistor.

* * * * *